United States Patent [19]

Khan et al.

[11] Patent Number: 5,247,655
[45] Date of Patent: Sep. 21, 1993

[54] SLEEP MODE REFRESH APPARATUS

[75] Inventors: Rashid N. Khan, Cupertino; Cheng Chen, San Jose; Chien-Feng Cheng, Cupertino; Brian Verstegen, Sunnyvale; Win-Sheng Cheng, Cupertino; Aurav Gollabinnie, San Jose, all of Calif.

[73] Assignee: Chips and Technologies, Inc., San Jose, Calif.

[21] Appl. No.: 432,680

[22] Filed: Nov. 7, 1989

[51] Int. Cl.⁵ ............................................. G11C 1/00
[52] U.S. Cl. .................................... 395/550; 395/750;
371/16.3; 364/DIG. 1; 364/270; 364/264;
364/216.91; 365/227
[58] Field of Search ............... 365/222, 227, 228, 229;
395/550, 750, 425; 371/16.3, 14; 364/200 MS
File, 900 MS File

[56] References Cited

U.S. PATENT DOCUMENTS

| | | | |
|---|---|---|---|
| 3,970,999 | 7/1976 | Elward | 395/400 |
| 4,086,627 | 4/1978 | Bennett et al. | 395/725 |
| 4,203,153 | 5/1980 | Boyd | 395/750 |
| 4,234,920 | 11/1980 | Van Ness et al. | 395/575 |
| 4,279,020 | 7/1981 | Christian et al. | 395/750 |
| 4,365,290 | 12/1982 | Nelms et al. | 364/707 |
| 4,403,283 | 9/1983 | Myntti et al. | 395/425 |
| 4,458,307 | 7/1984 | McAulis et al. | 395/575 |
| 4,461,003 | 7/1984 | Tamaki | 371/66 |
| 4,479,191 | 10/1984 | Nojima et al. | 364/707 |
| 4,523,295 | 6/1985 | Zato | 395/750 |
| 4,545,010 | 10/1985 | Salas et al. | 395/425 |
| 4,556,952 | 12/1985 | Brewer et al. | 364/900 |
| 4,590,553 | 5/1986 | Noda | 395/750 |
| 4,615,005 | 9/1986 | Maejima et al. | 364/200 |
| 4,658,352 | 4/1987 | Nagasawa | 395/575 |
| 4,698,748 | 10/1987 | Juzswik et al. | 395/750 |
| 4,716,463 | 12/1987 | Stacy et al. | 358/190 |
| 4,757,505 | 7/1988 | Marrington et al. | 371/66 |
| 4,758,996 | 7/1988 | Goldman | 365/230.02 |
| 4,761,736 | 8/1988 | Di Orio | 395/425 |
| 4,763,302 | 8/1988 | Yamada | 365/189.01 |
| 4,763,333 | 8/1988 | Byrd | 371/66 |
| 4,773,049 | 9/1988 | Takemae | 365/239 |
| 4,780,843 | 10/1988 | Tietjen | 395/725 |
| 4,782,468 | 11/1988 | Jones et al. | 365/229 |
| 4,802,135 | 1/1989 | Shinoda et al. | 365/233 |
| 4,849,875 | 7/1989 | Fairman et al. | 395/400 |
| 4,851,987 | 7/1989 | Day | 395/550 |
| 4,891,752 | 1/1990 | Fairman et al. | 395/425 |
| 4,896,294 | 1/1990 | Shimizu et al. | 365/149 |
| 4,899,272 | 2/1990 | Fung et al. | 365/230.03 |
| 4,907,150 | 3/1990 | Arroyo et al. | 395/575 |
| 4,907,183 | 3/1990 | Tanaka | 364/707 |
| 4,926,322 | 5/1990 | Stimac et al. | 395/500 |
| 4,956,807 | 9/1990 | Hosaka et al. | 395/575 |
| 4,980,836 | 12/1990 | Carter et al. | 364/483 |
| 4,984,213 | 1/1991 | Abdoo et al. | 365/230.03 |
| 4,985,871 | 1/1991 | Catlin | 365/230.06 |
| 4,999,794 | 3/1991 | Yakushiji | 364/707 |
| 5,005,157 | 4/1991 | Catlin | 365/193 |
| 5,021,983 | 6/1991 | Nguyen et al. | 364/707 |
| 5,163,153 | 11/1992 | Cole et al. | 395/750 |

OTHER PUBLICATIONS

IBM PC Convertible Technical Reference, vol. 1, 1986.

Primary Examiner—Rebecca L. Rudolph
Attorney, Agent, or Firm—Townsend and Townsend Khourie and Crew

[57] ABSTRACT

A circuit for waking a microprocessor from a sleep mode and providing it with its microprocessor clock long enough for a refresh, direct memory access (DMA) or master cycle operation to be done by external circuitry. The clock signal is then removed from the microprocessor to put it back into the sleep mode, thereby conserving energy. A hold signal is provided to the microprocessor to cause the microprocessor outputs to be put into a tri-state, high impedance condition, and thus relinquish control of the external bus to the external refreshing circuitry.

13 Claims, 3 Drawing Sheets

SLEEP MODE REFRESH APPARATUS

BACKGROUND

The present invention relates to circuits for refreshing dynamic memory during a microprocessor sleep mode.

In personal computers which are portable and operate off batteries, it is desirable to be able to put the computer system into a "sleep" mode to reduce power consumption. It is not possible to simply turn off all the circuitry, since dynamic random access memories (DRAM) must periodically receive a refresh signal so that the memory contents will not be lost. Many systems use a microprocessor and a separate memory management unit for controlling accesses to DRAM. Since the memory management unit is interposed between the dynamic memory and the microprocessor, the microprocessor can simply be turned off (by removing its clock) and the memory management unit itself can control the refreshing of the DRAM. However, it is possible that additional DRAM memory may be inserted in the I/O space of the system, where it would be directly coupled to the address and data bus of the microprocessor. Any dynamic memory connected to the microprocessor bus must either be refreshed by the microprocessor itself, or the microprocessor I/O circuits must be put into a tri-state, high impedance condition so that external circuitry can take control of the bus and do the refresh operation. In order to enter the tri-state condition, the microprocessor must be activated and be receiving its clock signal, and thus cannot be in a sleep mode.

SUMMARY OF THE INVENTION

The present invention provides a circuit for waking a microprocessor from a sleep mode and providing it with its microprocessor clock long enough for a refresh, direct memory access (DMA) or master cycle operation to be done by external circuitry. The clock signal is then removed from the microprocessor to put it back into the sleep mode, thereby conserving energy. A hold signal is provided to the microprocessor to cause the microprocessor outputs to be put into a tri-state, high impedance condition, and thus relinquish their control of the external bus.

The microprocessor is thus provided with the minimum clock frequency (and thus minimum power) during sleep, while providing a higher clock frequency to perform the refresh, thereby enabling the refresh to be quickly accomplished.

Certain microprocessors must have their clock provided so they can relinquish the bus for refresh, DMA and master cycle operations. During sleep, some microprocessors require a lower frequency clock while others (such as the Harris 80C286) can have the clock stopped. Certain of these microprocessors have an internal clock, which is a divided-down by 2 version of the supplied clock, which must be stopped and started in a certain phase for power conservation purposes. The present invention starts and stops the microprocessor clock in the correct phase of the microprocessor's internal, divided-down clock. This is accomplished by duplicating the microprocessor's internal divided-down clock to align the phases.

The present invention also provides a variety of divided versions of an external master clock which can be used for the sleep mode. Without knowing what master clock frequency would be provided, it would normally be necessary to reprogram a register to divide the actual clock provided by the appropriate number to give the necessary sleep frequency. Since some systems may provide a lower frequency clock than others, without appropriately programming the divide, a fixed divide might provide too slow of a clock frequency for the microprocessor. Accordingly, the present invention, by providing a plurality of divided versions of the external clock and a multiplexing circuit, enables a selection of an appropriate value by a simple input to the multiplexer, eliminating the need to reprogram an internal register.

For a fuller understanding of the nature and advantages of the invention, reference should be made to the ensuing detailed description taken in conjunction with the accompanying drawings.

DETAILED DESCRIPTION OF THE PREFERRED EMBODIMENT

Figure 1:
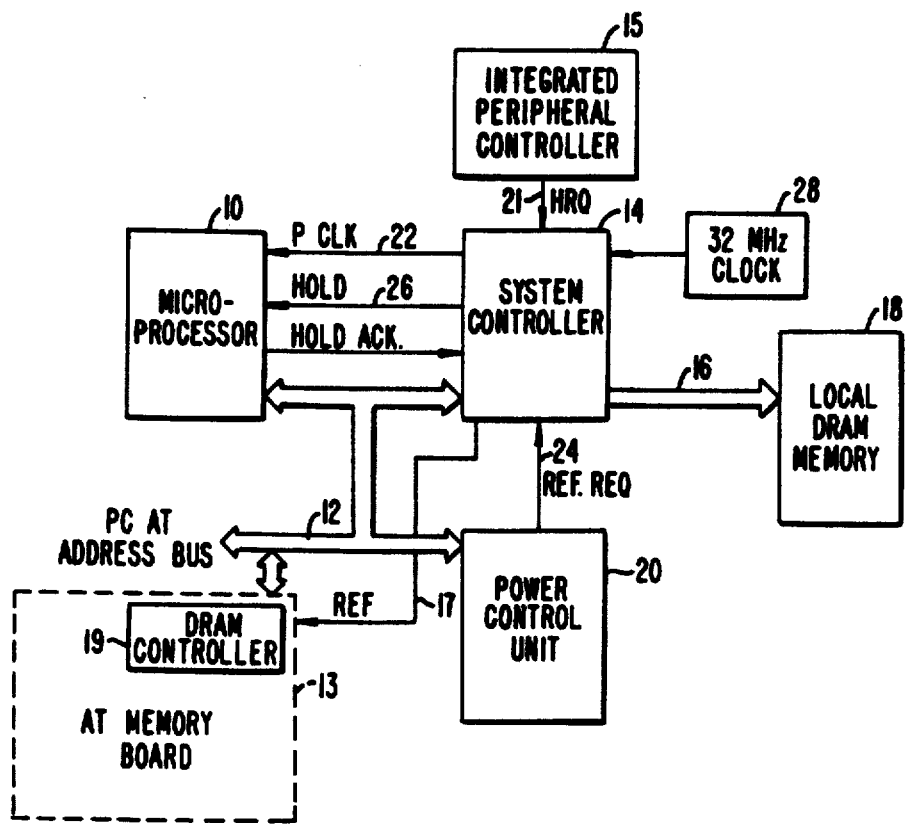
FIG. 1 is a block diagram of a system incorporating the sleep mode refresh apparatus of the present invention.

FIG. 1 shows a microprocessor 10 coupled to a system address and data bus 12. A system controller 14 is coupled to the same bus, and has an output local memory address bus 16 connected to local DRAM memory 18. System controller 14 controls the refreshing of local memory 18 over address bus 16, and can do this without help from the microprocessor, which has no direct connection to local memory 18. System controller 14 includes a CPU/BUS controller and a page/interleave and EMS memory controller, such as those in Chips and Technologies' parts 82C211 and 82C212. The circuit of system controller 14 is operated with a external clock oscillator 28 which preferably provides a 32 MHz clock.

Additional DRAM memory on an AT memory board 13 is connected to address bus 12 and is refreshed by a DRAM controller 19 on board 13. In order for DRAM controller 19 to send the necessary refresh signals, the outputs of microprocessor 10 must be put into a high impedance, tri-state condition.

In a sleep mode, the clock to microprocessor 10 is provided by system controller 14 on a PCLK line 22. The sleep clock frequency may be greatly reduced or zero, depending on the type of microprocessor used. A power control unit 20 includes an internal timer which periodically generates a refresh request signal. One power control unit is part number 82C636 available from Chips and Technologies. When system controller 14 receives the refresh request signal on line 24 from power control unit 20, an awake clock frequency is provided on line 22 to microprocessor 10. A hold signal is also provided on line 26 to microprocessor 10 to cause the outputs of microprocessor 10 to enter the tri-state condition, releasing bus 12. The awake clock frequency and hold signal are also generated for DMA and master cycles. DMA and master cycle requests are indicated by a hold request (HRQ) signal on a line 21 from an integrated peripheral controller 15.

Figure 2:
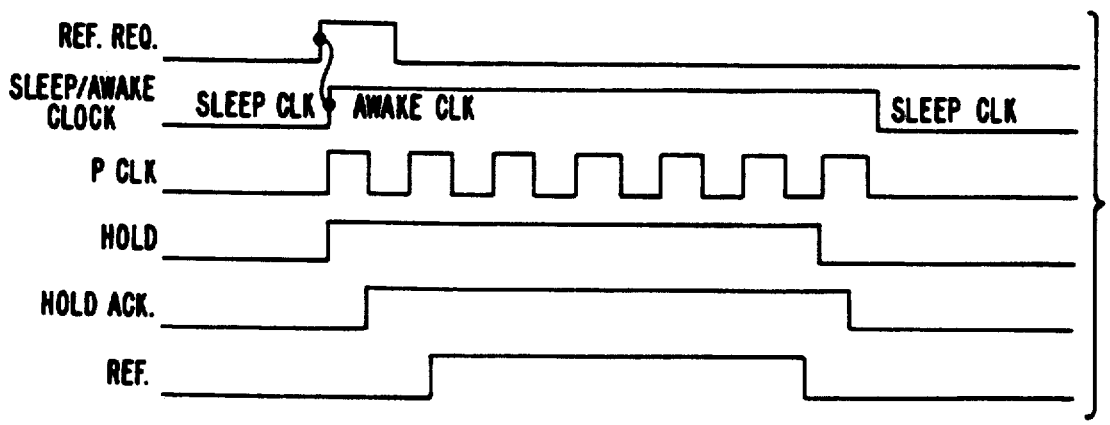
FIG. 2 is a timing diagram showing the signals generated by the circuit of FIG. 1.

The relative timing of the signals can be seen from FIG. 2. After a transition of the refresh request signal (REF. REQ.), the sleep/awake clock signal causes the PCLK to operate at an appropriate frequency. A hold signal is provided to the microprocessor to put its outputs in the tri-state condition. After a hold acknowledge (HOLD ACK) signal is received back from the microprocessor, refresh is commenced by system controller 14 providing the REF signal on line 17 to DRAM controller 19 on AT memory board 13. While the hold signal, and thus the REF signal, is high, refresh signals to refresh the dynamic memory on bus 12 are generated by DRAM controller 19. At the same time, system controller 14 provides refresh signals to local memory 18. This timing is not necessary for local memory 18, however, since control of AT bus 12 is not needed. The hold signal is held high for a period of time sufficient for the refresh process to complete. When the hold signal is removed, the sleep clock is again provided to the microprocessor.

Figure 3:
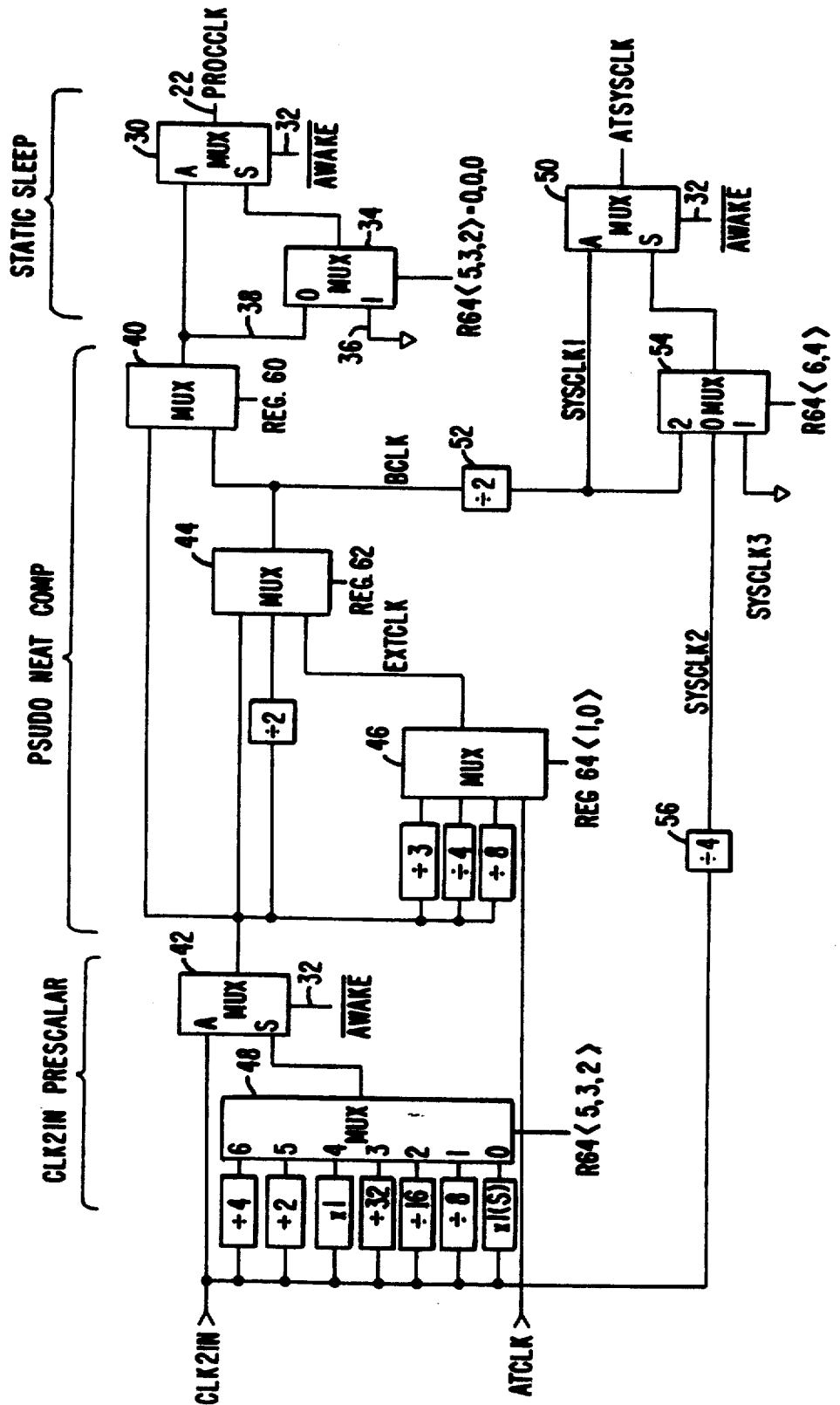
FIG. 3 is a block diagram showing the generation of the different clock frequencies according to the present invention.

FIG. 3 is a block diagram of the portions of system controller 14 used to provide the sleep clock in the present invention. The PCLK signal on line 22 is provided from a multiplexer 30 which uses either a sleep (S) or awake (A) input in accordance with a sleep select line 32. The sleep input is in turn provided by a multiplexer 34, which has two inputs. One input is a grounded input 36 for microprocessors which can have their clock completely shut off during a sleep mode. The other input on a line 38 provides a clock of some frequency for microprocessors which can operate on a low frequency during sleep, but cannot be turned off. This frequency signal is provided by a multiplexer 40 which either provides an external clock CLK2IN from multiplexer 42 or a divided version of that clock from one of multiplexers 44, 46 and 48.

While a sleep is in operation, an AT system clock, ATSYSCLK, is provided to memory control circuit 20 and the other operating circuits from the output of a multiplexer 50 at the bottom of FIG. 3. Multiplexer 50 receives its signal either from multiplexer 44 after passing through a divide by 2 circuit 52 or from a multiplexer 54. Multiplexer 54 can provide the external clock CLK2IN after being divided by 4 by a divide by 4 circuit 56.

Multiplexers 30, 42 and 50 are selected by the sleep mode signal, $\overline{\text{AWAKE}}$. The remaining multiplexers are selected according to register values which are provided to the select inputs.

Figure 4:
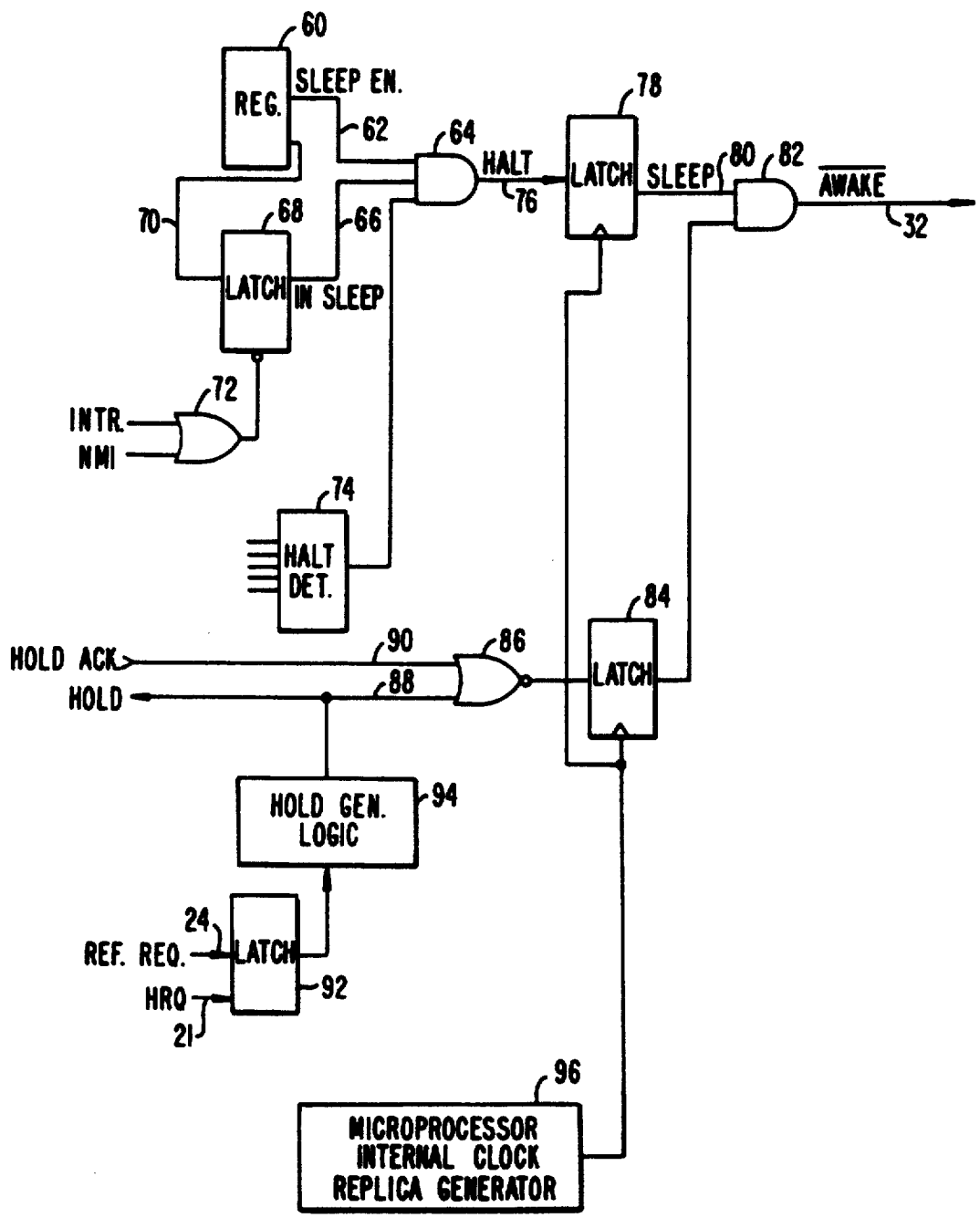
FIG. 4 is a block diagram showing the circuitry for controlling the processor clock for putting into a sleep or awake mode.

FIG. 4 shows the generation of the $\overline{\text{AWAKE}}$ signal for FIG. 3. A register 60 provides a sleep enable bit on a line 62 to an AND gate 64. This bit is set to enable the sleep mode. The sleep mode will be entered only if the other two inputs of AND gate 64 are also true. One of these inputs is the INSLEEP signal on line 66 from latch 68. This latch is a value on a line 70 from register 60. The signal is present unless an interrupt signal (INTR) or non-maskable interrupt (NMI) is provided to the reset input of latch 68 through OR gate 72. This mechanism allow the interrupt or non-maskable interrupt to cause an exit from the sleep mode (for DMA or master cycle). The other input from AND gate 64 is from halt detect logic 74 which has inputs which are decoded to determine when there has been a halt in the program operation.

The halt signal on line 76 is provided to latch 78. The output of latch 78 is provided as a sleep signal on line 80 to an AND gate 82. The output of AND gate 82 is the $\overline{\text{AWAKE}}$ signal on line 32 of FIG. 3.

The other input of AND gate 82 is from the output of a latch 84. Latch 84 is triggered by a NOR gate 86 which requires the presence of either a hold signal on line 88 or a hold acknowledge signal on line 90. The hold signal is generated in response to a refresh request, DMA, or master cycle signal on a line 24 to latch 92. The output of latch 92 is provided to the normal hold generation logic 94, which then generates the hold signal. The hold acknowledge is provided back from the microprocessor. While only the hold signal is needed to start the awake clock, both the hold and hold acknowledge must be removed before the microprocessor is put back to sleep.

Figure 5:
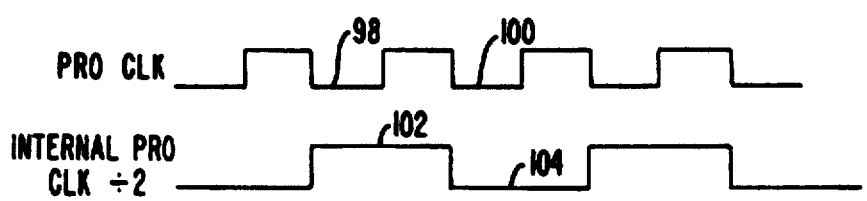
FIG. 5 is a timing diagram showing the internal processor divide by 2 clock.

Latches 78 and 84 are clocked by a microprocessor internal clock replica generator 96. Clock circuit 96 includes a divide by 2 circuit which mimics the internal divide by 2 clock of the microprocessor to ensure that the microprocessor is awakened and put to sleep in the same phase as the internal divide by 2 clock of the microprocessor. This is illustrated in FIG. 5. As can be seen in FIG. 5, the processor clock (PRO CLK) can have a low value at points 98 or 100, which appear identical. However, the internal processor clock divide by 2 is at a high state 102 for portion 98 and a low state, or alternate phase, at a portion 104 corresponding to portion 100 of the processor clock. Since some microprocessors will use less power and operate more efficiently if they are stopped and started in the second phase, this tracking circuit allows waking from sleep in the first phase to conserve power. This also requires that the processor clock be put to sleep in a known phase, which is done by using the same clock from circuit 96 to latch the halt signal. Latches 78 and 84 thus insure that the microprocessor clock is stopped and started, respectively, in the correct phase.

As will be understood by those familiar with the art, the present invention may be embodied in other specific forms without departing from the spirit or essential characteristics thereof. For example, the microprocessor clock could have fewer or a greater number of selections of clock frequencies during the sleep mode. Also, the frequency of the microprocessor clock during the sleep mode refresh could be less than its normal awake frequency. Accordingly, the disclosure of the present embodiment of the invention is intended to be illustrative, but not limiting, of the scope of the invention which is set forth in the following claims.

What is claimed is:

1. A circuit for putting a system into a state wherein dynamic memory can be refreshed during a sleep mode wherein a clock frequency of a microprocessor is reduced, said system having said microprocessor and separate refreshing circuitry coupled to said memory by an address bus said microprocessor having a lock input and a hold input, said microprocessor being operative to cause internal circuitry coupled to said address bus to enter a tri-state, high impedance condition in response to a signal on said hold input, said circuit comprising:

means for providing a system clock to elements other than said microprocessor in said system;

means for selectively providing a microprocessor clock having a sleep frequency for said sleep mode or an awake frequency greater than said sleep frequency to said clock input of said microprocessor; and means, responsive to a control signal indicating a refresh operation, for providing said hold signal to said microprocessor and selecting said awake frequency from said means for providing a microprocessor clock.

2. The circuit of claim 1 wherein said control signal is an OR function of a refresh request signal, a DMA signal, and a master cycle signal.

3. The circuit of claim 1 further comprising means for activating and deactivating said microprocessor clock during a second phase of an external divided-down clock which is a duplicate of a divided-down clock internal to said microprocessor, said external divided-down clock and said system clock both originating from an external clock.

4. The circuit of claim 1 wherein said means for providing said hole signal and selecting said awake frequency also provided said hold signal and selects said awake frequency in response to an interrupt signal or a non-maskable interrupt signal.

5. The circuit of claim 1 wherein said means for providing said hold signal and selecting said awake frequency includes means for selecting said sleep frequency in response to detection of a halt signal.

6. The circuit of claim 1 wherein said means for selectively providing comprises a multiplexer for selecting either said sleep frequency or said awake frequency.

7. The circuit of claim 6 further comprising a second multiplexer for providing one of a plurality of sleep frequencies.

8. The circuit of claim 7 further comprising a first and a second means for providing different divided frequencies from an external clock frequency to a first and a second input of said second multiplexer.

9. A circuit for enabling the refreshing of a dynamic memory during a sleep mode in a system having a microprocessor coupled to said memory by an address bus, said microprocessor having a clock input and a hold input, said microprocessor being operative to cause internal circuitry coupled to said address bus to enter a tri-state, high impedance condition in response to a signal on said hold input, said circuit comprising:

a first multiplexer for providing either a sleep clock input or an awake clock input to said microprocessor clock input;

a register for storing a bit enabling a sleep mode;

first logic means for providing a sleep enable signal to a select input of said first multiplexer in response to an output of said register and a halt signal;

second logic means for providing an awake enable signal to a select input of said first multiplexer in response to a refresh, DMA or master cycle signal;

third logic means for generating a hold signal to said hold input of said microprocessor in response to said refresh, DMA or master cycle signal; and fourth logic means for providing an awake signal to said select input of said first multiplexer in response to an interrupt signal.

10. The circuit of claim 9 further comprising a second multiplexer for selecting one of a plurality of sleep frequencies as an input to said first multiplexer.

11. The circuit of claim 10 further comprising a plurality of divide circuits coupled to an external clock for providing a plurality of divided-down clock frequency signals to said second multiplexer.

12. The circuit of claim 9 further comprising a second multiplexer coupled to said awake input of said first multiplexer for providing one of a plurality of clock frequencies.

13. The circuit of claim 9 further comprising means for synchronizing said sleep and awake signals to the phase of a divided-down version of said microprocessor clock signal.

* * * * *